United States Patent
Petersen et al.

(10) Patent No.: US 11,740,279 B2
(45) Date of Patent: Aug. 29, 2023

(54) MEASURING TEMPERATURE-MODULATED PROPERTIES OF A TEST SAMPLE

(71) Applicant: KLA CORPORATION, Milpitas, CA (US)

(72) Inventors: Dirch Hjorth Petersen, Herlev (DK); Ole Hansen, Horsholm (DK); Henrik Hartmann Henrichsen, Copenhagen (DK); Benny Guralnik, Valby (DK)

(73) Assignee: KLA CORPORATION, Milpitas, CA (US)

( * ) Notice: Subject to any disclaimer, the term of this patent is extended or adjusted under 35 U.S.C. 154(b) by 84 days.

(21) Appl. No.: 17/235,902

(22) Filed: Apr. 20, 2021

(65) Prior Publication Data

US 2021/0333316 A1    Oct. 28, 2021

(30) Foreign Application Priority Data

Apr. 24, 2020  (EP) .................................... 20171264
Mar. 30, 2021  (EP) .................................... 21165918

(51) Int. Cl.
  *G01R 31/28*  (2006.01)
  *H01L 21/66*  (2006.01)

(52) U.S. Cl.
  CPC .......... *G01R 31/2812* (2013.01); *H01L 22/12* (2013.01); *H01L 22/14* (2013.01); *H01L 22/34* (2013.01)

(58) Field of Classification Search
  None
  See application file for complete search history.

(56) References Cited

U.S. PATENT DOCUMENTS

2002/0153909 A1* 10/2002 Petersen ................ G01R 1/073
                                                324/755.01
2010/0271059 A1   10/2010 Petersen et al.
(Continued)

FOREIGN PATENT DOCUMENTS

CN       110044957 A  *  7/2019  ............. G01N 25/20
JP       2000352572 A     12/2000
(Continued)

OTHER PUBLICATIONS

English translation of CN-110044957-A, 2019, Lu Ming-Hui et al.*
(Continued)

*Primary Examiner* — Jermele M Hollington
*Assistant Examiner* — Suresh K Rajaputra
(74) *Attorney, Agent, or Firm* — Hodgson Russ LLP (57) ABSTRACT

A physical property of a test sample with a conductive or semi-conductive material (line/area/volume) is obtained. Periodic Joule heating is induced within the test sample by passing an AC current across a first pair of probe terminals electrically connected to the test sample, measuring the voltage drop across a second pair of probe terminals electrically connected to the test sample at one and three times the fundamental excitation frequency of the current-conducting terminals, and calculating the temperature-modulated property/properties of the test sample as a function of the potential drop measurement(s). This includes: a) determining a value proportional to the TCR of the test sample, b) a geometric parameter of the test sample (affected by coupling of its TCR to heat transport to/from the test sample), or c) the true resistivity of the test sample at the ambient experimental temperature by subtracting measurable and accountable TCR offset(s).

20 Claims, 7 Drawing Sheets

(56) References Cited

U.S. PATENT DOCUMENTS

| | | | |
|---|---|---|---|
| 2014/0015552 A1 | 1/2014 | Wang et al. | |
| 2019/0310295 A1 | 10/2019 | Osterberg et al. | |
| 2020/0072869 A1 | 3/2020 | Johnson, III et al. | |
| 2021/0333228 A1* | 10/2021 | Petersen | G01R 31/2858 |

FOREIGN PATENT DOCUMENTS

| | | |
|---|---|---|
| JP | 2003509695 A | 3/2003 |
| KR | 10-0319130 B1 | 4/2002 |
| KR | 20070054568 A | 5/2007 |

OTHER PUBLICATIONS

WIPO, ISR for International Application No. PCT/US2021/028509, dated Aug. 6, 2021.

Cagliani et al., "Optimized electrode configuration for current-in-plane characterization of magnetic tunnel junction stacks". Measurement science and technology, IOPscience, vol. 28, 025012, Feb. 2017.

Cagliani et al., "Breakthrough in current-in-plane tunneling measurement precision by application of multi-variable fitting algorithm", Review of scientific instrument, AIP, vol. 88, 095005, Sep. 2017.

Petersen et al., "Scanning microscopic four-point conductivity probes", Sensors and Actuators A: Physical, Elsevier, vol. 96, issue 1, pp. 53-58, Jan. 31, 2002.

Worledge et al., "Magnetoresistance measurement of unpatterned magnetic tunnel junction wafers by current-in-plane tunneling", Applied Physics Letter, vol. 83, issue 1, pp. 84-86, Jun. 30, 2003.

Petersen et al., "Micro-four-point probe Hall effect measurement method", Journal of Applied Physics, AIP, vol. 104, 013710, Jul. 11, 2008.

Chain et al., "In-line electrical probe for CD metrology", Process, Equipment, and Materials Control in Integrated Circuit Manufacturing II, SPIE, vol. 2876, Sep. 13, 1996.

Van der Pauw, "A method of measuring the resistivity and Hall coefficient on Lamellae of arbitrary shape," Philips Tech. Rev., vol. 20, pp. 220-224, 1958.

Cahill, "Thermal conductivity measurement from 30 to 750 K: the $3\omega$ method," Rev. Sci. Instrum., vol. 61, pp. 802-808, 1990.

Koon, et al., "Sensitivity of resistive and Hall measurements to local inhomogeneities," J. Appl. Phys., vol. 114, 163710, Oct. 29, 2013.

Koon, et al., "Sensitivity of resistive and Hall measurements to local inhomogeneities: Finite-field, intensity, and area corrections," J. Appl. Phys., vol. 116, 133706, Oct. 7, 2014.

Miccoli et al., "The 100th anniversary of the four-point probe technique: the role of probe geometries in isotropic and anisotropic systems", Journal of Physics: Condensed matter, May 18, 2015, p. 223201-1 to 223201-29, vol. 27, IOPScience, USA.

Thorsteinsson et al., "Accurate microfour-point probe sheet resistance measurements on small samples", Review of Scientific Instruments, May 1, 2009, p. 053902-1 to 053902-10, vol. 80, AIP, USA.

Folkersma et al., "Electrical characterization of single nanometer-wide Si fins in dense arrays", Beilstein Journal of Nanotechnology, Jun. 25, 2018, p. 1863-1867, vol. 9.

Bogdanowicz et al., "Width-dependent sheet resistance of nanometer-wide Si fins as Measured with Micro Four-Point Probe", Dec. 7, 2017, Physica status solidi. A: Applications and materials science, p. 1700857, vol. 215, Issue No. 6 (2018), Wiley online library.

Rosseel et al., "Monitoring of local and global temperature non-uniformities by means of Therma-Probe and Micro Four-Point Probe metrology", 17th International Conference on Advanced Thermal Processing of Semiconductors, Sep. 29, 2009, pp. 6, IEEE Xplore, USA.

Petersen et al., "Review of electrical characterization of ultra-shallow junctions with micro four-point probes", Journal of Vacuum Science & Technology B, Mar. 1, 2010, pp. 7, vol. 28, issue 1, AVS/AIP.

Wells et al., "Surface-sensitive conductance measurements on clean and stepped semiconductor surfaces: Numerical simulations of four point probe measurements", Surface Science, May 15, 2008, pp. 1742-1749, vol. 602, Issue 10, Elsevier.

Folkersma et al., "Electrical contact formation in Micro Four-Point Probe measurements", physica status solidi A: Applications and material science, Oct. 31, 2019, p. 1900579, vol. 217 Issue 5.

EPO, Partial European Search Report for EP Application No. 20171264.3, dated Oct. 27, 2020.

* cited by examiner

MEASURING TEMPERATURE-MODULATED PROPERTIES OF A TEST SAMPLE

CROSS-REFERENCE TO RELATED APPLICATIONS

This application claims priority to the European Patent Application No. 20171264.3 filed Apr. 24, 2020 and to the European Patent Application No. 21165918.0 filed Mar. 30, 2021, the disclosures of which are hereby incorporated by reference.

BACKGROUND OF THE DISCLOSURE

The present invention relates to measuring an electric property of a test sample (device under test), such as a wafer having a number of integrated circuits or memory cells, or any material used in making electrical components where the electrical or geometrical properties need to be measured.

Typically, microscopic multi-terminal probes are used on the test sample by landing a number of cantilevers on the test sample and injecting a current into the test sample followed by a measurement of the voltage between two of the cantilevers.

In this way, it may be verified if the wafer or a particular part of a circuit on the wafer is according to given or desired specifications.

However, as electrical circuit components become increasingly smaller, even small test currents may lead to false test values, i.e. the current may lead to heating of the test sample which may result in a measured resistance, which is markedly different (typically larger) than what would be measured at room temperature without the localized heating.

Such thermal effects may also be utilized to measure properties that are temperature dependent, such as the temperature coefficient of resistance. These effects may even be utilized to determine test sample geometries, or the presence or absence of structural and/or compositional defects therein.

BRIEF SUMMARY OF THE DISCLOSURE

The above object and advantages together with numerous other objects and advantages, which will be evident from the description of the present invention, are according to a first aspect of the present invention obtained by:

A method for measuring a property in response to a temperature modulation of a test sample, said method comprising: providing said test sample, said test sample being made of an electrically conducting or semiconducting material such as an electrically conducting layer or electrically conducting line or magnetic tunnel junction; providing at least two terminals, such as four terminals, and at least two or four electrically conducting interconnections between said two or four terminals and said electrically conducting or semiconducting material, said two or four electrically conducting interconnections contacting two or four positions at said electrically conducting or semiconducting material; providing a power source and an electric circuit for generating a current and injecting said current into said electrically conducting or semiconducting material by means of said terminals; measuring the voltage across a part of said electrically conducting or semiconducting material by means of said terminals; and determining said property as a function of the value of the third harmonic frequency component of said measured voltage.

The property can be determined as a function of said measured voltage, such as the value of the fundamental frequency component of said measured voltage.

According to a second aspect of the present invention, the above objects and advantages are obtained by:

A method for determining the temperature coefficient of resistance, said method comprising: providing said test sample, said test sample being made of an electrically conducting or semiconducting material, such as an electrically conducting layer or electrically conducting line or magnetic tunnel junction; providing a set of terminals including at least four terminals, and at least four electrically conducting interconnections between said terminals and said electrically conducting or semiconducting material, said four electrically conducting interconnections contacting four positions at said electrically conducting or semiconducting material; providing a power source and an electric circuit for generating a current; injecting a first current into said test sample by means of a first combination of two terminals from said set of terminals; measuring a first voltage by means of a second combination of two terminals from said set of terminals; injecting a second current into said test sample by means of a third combination of two terminals from said set of terminals; measuring a second voltage by means of a fourth combination of two terminals from said set of terminals; and determining the temperature coefficient of resistance or a value proportional to the temperature coefficient of resistance as a function of said first current, said second current, said first voltage, and said second voltage.

A set is to be understood as a collection of distinct elements, i.e. a collection of for example four terminals.

According to a third aspect of the present invention, the above objects and advantages are obtained by:

A method for determining an electric property of a test sample, said method comprising: providing said test sample, said test sample being made of an electrically conducting or semiconducting material, such as an electrically conducting layer or electrically conducting line or magnetic tunnel junction; providing at least two terminals such as four terminals, and at least two electrically conducting interconnections between said two terminal and said electrically conducting or semiconducting material, said two electrically conducting interconnections contacting two positions at said electrically conducting or semiconducting material; providing a power source and an electric circuit for generating a current and injecting said current into said electrically conducting or semiconducting material by means of said terminals; measuring the voltage across a part of said electrically conducting or semiconducting material by means of said terminals; and determining the electric resistance of said electrically conducting or semiconducting material at reference temperature as a function of said injected current, said measured voltage, and the value of the third harmonic frequency component of said measured voltage.

Measuring a property in response to a temperature modulation means heating the test sample to a temperature above a background temperature and determining how the heat affects the test sample.

For example, heat may diffuse away from a line in the test sample at various rates depending on the physical shape of the line. In this way, the shape of the test sample may also be inferred. The property may in this way be said to be a temperature-related property.

The property may also be the temperature coefficient of resistance, or a thermoelectric coefficient such as the Peltier coefficient, or the Joule-Thomson coefficient.

A current source is an electrical circuit that provides an electrical current for use in a measurement. The current source may be provided as a voltage source wherein the provided voltage may be converted to a current.

Screening the test sample means performing a measurement and determining if the test sample complies with a manufacturing specification. Such screening is typically performed during manufacturing. If the test sample meets the specification it may be accepted and continue in the production line. If the test sample does not meet the specification, it may be rejected (discarded).

An example may be the shape of a part of the test sample that is screened. If the shape does not meet the specification, the functionality of the test sample may be compromised and the test sample may be rejected. The shape may be the cross section of a part of the test sample, such as an electrical component or interconnection between components in the test sample. It may also be a notch or indentation present somewhere in the test sample. It may also be line edge roughness, or surface roughness, or other structural defects or compositional impurities, or inhomogeneous electric properties, or voids/cavities, or grain boundaries, or grain-size distributions, etc.

Determining a shape of a test sample refers to determining a shape of a part of the test sample, such as an electrical component or interconnection between components in the test sample. The shape may be the cross section, the length section, presence and amount of periodic features such as notches, the thickness of a feature, and so on.

DESCRIPTION OF THE DRAWINGS

For a fuller understanding of the nature and objects of the disclosure, reference should be made to the following detailed description taken in conjunction with the accompanying drawings.

FIGS. 2A-2C illustrates three different profiles of a fin 16 having three different fin aspects ratios.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1A:
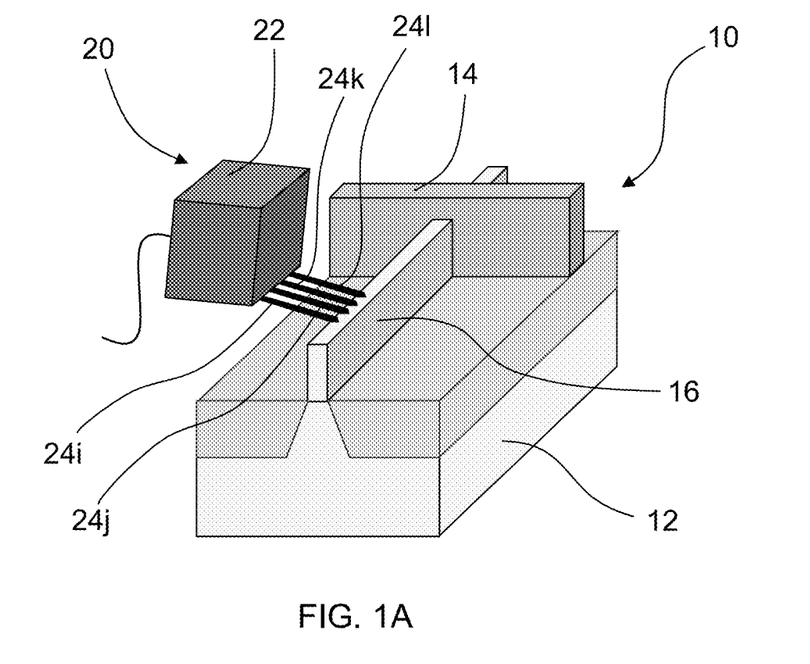
FIG. 1A illustrates a part of test sample or device under test together with a micro multi-terminal probe, consisting of four cantilevers.

FIG. 1A illustrates a part of test sample or device under test together with a micro multi-terminal probe, consisting of four cantilevers.

The part of the test sample 10 illustrates a fin field-effect transistor (FinFET) on a substrate 12 preferably a silicon substrate. The source and drain terminals are separated by the gate 14.

The measurement in FIG. 1A on the fin of a FinFET is an example and the measurement may be performed on other circuit parts of a test sample, for example a memory cell such as a magneto resistive random-access memory (MRAM), or another type of transistor, or diode, or a bulk material, or circuit lines between components.

Figure 1B:
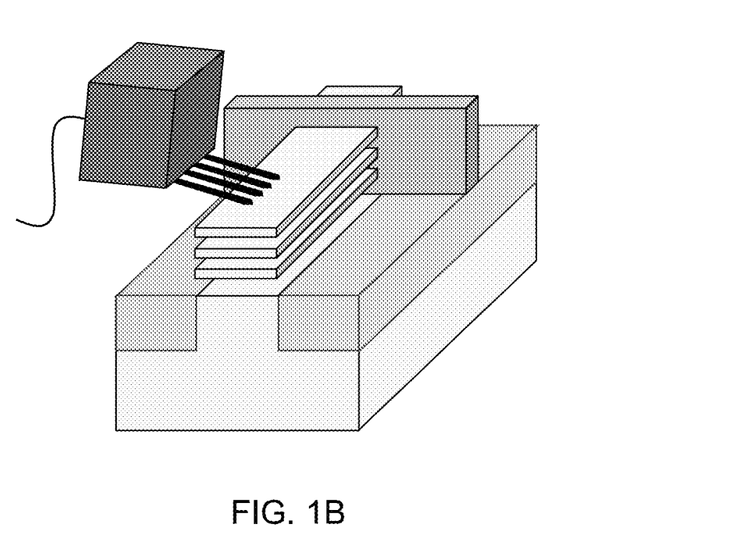
FIG. 1B illustrates another part of test sample or device under test, together with the same micro multi-terminal probe.

FIG. 1B illustrates another part of test sample or device under test, together with the same micro multi-terminal probe.

The part of the test sample illustrates a gate all-round field-effect transistor (GAAFET) where instead of a fin, three nanosheets are separated by the gate.

A micro multi-terminal probe (specifically, a micro four-point probe, M4PP) 20 is shown in contact with the test sample in that the four cantilevers are in contact with the surface of the sample, such that a physical property of the sample may be determined.

The micro four-point probe comprises a probe body 22, and four cantilevers including a first cantilever 24$i$ extending from the probe body, a second cantilever 24$k$, a third cantilever 24$j$, and a fourth cantilever 24$l$.

Each cantilever constitutes an electrode for contacting the test sample. The distance (pitch) between any two neighbouring cantilevers may be for example around 0.1 µm, or 1 µm, or 10 µm, or 100 µm.

Each cantilever has a free end opposite the probe body. Each free end constitutes an electrode tip.

The four cantilevers are designated as a first arbitrary pair of electrodes i and j for injecting an electric current (e.g. i for the positive and j for the negative current terminals, respectively), and as a second arbitrary pair of electrodes k and l for measuring the difference in electric potential/voltage between the two electrode tips in the second pair of electrodes (e.g. k for the positive and l for the negative potential terminals, respectively).

A collinear four-point probe is a four-point probe in which the locations of the electrode terminal contacts with the material under test vary only in one direction, e.g. $x_i \neq x_j \neq x_k \neq x_l$, while $y_i = y_j = y_k = y_l$ and $z_i = z_j = z_k = z_l$.

The multi-terminal probe may have more than four cantilevers, for example between four and 20 such as 7, 11 or 12. These cantilevers, in turn, may be subsampled to form arbitrary four-point probes. For example for a probe with seven cantilevers, there are $$\frac{7!}{4!(7-4)!} = 35$$

unique four-point subprobes. For each subprobe, each of its cantilevers can further be assigned as terminal i, or j, or k, or l, in a mutually-exclusive manner. In any four-point subprobe, there are exactly 4!=24 such unique and mutually-exclusive terminal assignments (configurations). The total number of unique four-point resistance measurements that can be performed by a given probe is the product of the amount of its unique four-point subprobes, and the amount of unique four-point configurations per subprobe, e.g.

$$\frac{7!\,4!}{4!\,(7-4)!} = 840$$

in case of a probe with seven terminals.

The measurement of a test sample may involve an arbitrary number of terminals, and correspondingly a possibly arbitrary number of terminal pads, such as two pads for a two terminal sensing or four pads for four terminal sensing or even more pads.

From the terminal, lines or interconnections may extend to the part of the test sample, which is to be tested.

This may be the case if the part to be tested is too small with respect to the probe, prohibiting a direct contact between all the measurement terminals and the part to be tested. This may also be the case if the part to be tested is structurally buried under a functional oxide, another part blocking access to the part to be measured, and so on.

In such a case the interconnections can be said to correspond to the cantilevers/probe electrodes in the probe example (or the lines on the probe that extends from probe pads to the cantilever tips).

In FIG. 1A, all four electrode tips are illustrated in contact with a fin 16, such that a physical property of the fin may be determined. This can for example be the resistance, or the geometric profile (in either cross section on along the fin), or surface roughness and/or density of defects, or whether or not the fin meets a specification, or a value proportional to the temperature coefficient of resistance, or a value proportional to the Seebeck coefficient, or a value proportional to the Peltier coefficient, or a value proportional to the thermal conductivity, or a value proportional to the temperature coefficient of resistance, etc.

The measured two-point resistance $R_{ij}$ by e.g. a collinear micro four-point probe shown in FIGS. 1A and 1B may be converted to for example the contact resistance $R_{C,i}$ and $R_{C,j}$ of electrodes i and j as follows. A two-point load resistance $R_{ij}$ between the first and the second current-injecting electrodes (i and j respectively) corresponds to the in-series (sum) resistance of the sample $R_{sample}$, plus the lead resistances $R_{lead}$ in each of the wires connecting the voltmeter to the sample, plus the contact resistance $R_C$ in the proximity of each electrode-sample interface:

$$R_{ij} = R_{sample} + (R_{lead,i} + R_{lead,j}) + (R_{C,i} + R_{C,j}).$$

For an arbitrary number n of two-point resistance measurements using m electrodes, the above formula can be solved in a matrix form to obtain the contact resistance of each electrode $R_C$ via:

$$R_C = (M^T M)^{-1} M^T (R_{load} - R_{sample} - M R_{lead}).$$

granted that rank(M)≥m, i.e. that the number of independent observations is equal or greater than the number of unknowns. In the latter equation, $R_{load}$ and $R_{sample}$ are column vectors n×1 containing the observed load resistance between electrode pairs i and j, and estimates of the corresponding sample resistance, respectively; $R_{lead}$ and $R_C$ are row vectors 1×m, containing the lead resistance of each electrode (known from design), and the contact resistance to be solved for, respectively. The sparse matrix M is n×m, marking the current-conducting electrodes per each measurement configuration via M(n, i)=M(n, j)=1, while all its other elements are zero.

Considering a spatially uniform material, the transfer resistance R as measured by a micro four-point probe, e.g. a collinear four-point probe shown in FIGS. 1A and 1B, can be related to the spatially-uniform resistivity ρ of the material according to:

$$R = \rho/g.$$

where g is a "transfer function", dependent on the frequency f of the electrical current, the geometry Ω of the probed domain, the distribution of the four-point cantilevers in space, the external magnetic field, and so forth. At zero external magnetic fields and at low current frequencies (in the so-called quasi-dc regime), the transfer function g of a collinear four-point probe in some common domain geometries is as follows. For a thin wire of length L (L>>|$x_m - x_n$|) and a cross-sectional area A, approximating a 1D electric domain, g is given by:

$$g = A/L. \tag{1D}$$

For an infinite thin sheet of thickness d (d>>|$x_m - x_n$|), approximating a 2D electric domain, g is given by:

$$g = \frac{2\pi d}{\ln\left(|x_i - x_k|^{-1} \cdot |x_i - x_l| \cdot |x_j - x_k| \cdot |x_j - x_l|^{-1}\right)}. \tag{2D}$$

For bulk halfspace, corresponding to a 3D electric domain, g is given by:

$$g = \frac{2\pi}{|x_i - x_k|^{-1} - |x_i - x_l|^{-1} - |x_j - x_k|^{-1} + |x_j - x_l|^{-1}}. \tag{3D}$$

Other expressions of g can be derived for more specific domain geometries, frequencies outside the quasi-dc regime, non-negligible magnetic fields, non-collinear four-point probes, finite electrical contact sizes, and so forth.

The sensitivity Ŝ of the transfer resistance R (as defined above) to spatial variations in resistivity of the probed domain Ω, can be defined as:

$$\hat{S} = \frac{J_{ij}(r) \cdot J_{kl}(r)}{\int_\Omega [J_{ij}(r) \cdot J_{kl}(r)] d\Omega}, \int_\Omega \hat{S}(r) d\Omega = 1.$$

where r is a location vector in space, represented by cartesian coordinates x in the 1D domain, (x,y) in 2D domain, and (x,y,z) in 3D domain; $J_{ij}(r)$ is the electric current density at r due to current injection at terminals i and j; $J_{kl}(r)$ is the electric current density at r due to current injection at terminals k and l; (•) is the dot vector product; and dΩ is an infinitesimal unit of length, or area, or volume of the probed domain. Ŝ is a spatial weighting function with units of [$m^{-n}$], where n is the dimensionality of the domain.

It can be shown that the sensitivity of transfer resistance to local variations in resistivity within a thin wire (1D electric domain) is unity:

$$\hat{S}(x) = 1.$$

For an infinite thin sheet of thickness d (2D electric domain), the sensitivity is:

$$\hat{S}(x, y) = \frac{d/2\pi}{\ln\left(|x_i - x_k|^{-1} \cdot |x_i - x_l| \cdot |x_j - x_k| \cdot |x_j - x_l|^{-1}\right)} \times$$

$$\left[\left(\frac{x-x_i}{r_i^2} - \frac{x-x_j}{r_j^2}\right)\left(\frac{x-x_k}{r_k^2} - \frac{x-x_l}{r_l^2}\right) + y^2\left(\frac{1}{r_i^2} - \frac{1}{r_j^2}\right)\left(\frac{1}{r_k^2} - \frac{1}{r_l^2}\right)\right];$$

$$r_q = \sqrt{(x-x_q)^2 + y^2}.$$

For a bulk halfspace (3D electric domain), the sensitivity is:

$$\hat{S}(x, y, z) = \frac{1/2\pi}{\left(|x_i - x_k|^{-1} - |x_i - x_l|^{-1} - |x_j - x_k|^{-1} + |x_{ij} - x_l|^{-1}\right)} \times$$

$$\left[\left(\frac{x-x_i}{r_i^3} - \frac{x-x_j}{r_j^3}\right)\left(\frac{x-x_k}{r_k^3} - \frac{x-x_l}{r_l^3}\right) + (y^2 + z^2)\left(\frac{1}{r_i^3} - \frac{1}{r_j^3}\right)\left(\frac{1}{r_k^3} - \frac{1}{r_l^3}\right)\right],$$

$$r_q = \sqrt{(x-x_q)^2 + y^2 + z^2}.$$

Other expressions of S can be derived for more specific domain geometries, frequencies outside the quasi-dc regime, non-negligible magnetic fields, non-collinear four-point probes, finite electrical contact sizes, and so forth.

Considering a spatially non-uniform resistivity p of the probed material, the transfer resistance R measured by a micro four-point probe is given by:

$$R = \frac{1}{g}\int_\Omega \rho(r)\hat{S}(r)d\Omega.$$

which for a spatially-uniform $\rho(r)=\rho$ reduces to the former relation $R=\rho/g$, but extends the treatment to situations where resistivity is spatially variable. In the equation above, the transfer resistance is a spatial integral, where each local resistivity $\rho(r)$ is further weighted by the probe's sensitivity $\hat{S}(r)$ to resistivity changes at each particular location.

Since resistivity depends on temperature, subjecting a material to thermal gradients leads to spatial variations in its resistivity. The dependence of resistivity $\rho$, or more generally, of resistance R, on the temperature T may be expressed as:

$dR/R = d\rho/\rho = \alpha dT.$ where $\alpha$ is the temperature coefficient of resistivity (TCR), and $d\rho$, $dR$ and $dT$ are infinitesimally small increases in resistivity, transfer resistance and temperature, respectively. For small temperature changes $\Delta T$, a first-order linear approximation is usually made:

$\rho = \rho_0(1+\alpha\Delta T).$ where $\rho_0$ is the resistivity at the background temperature, i.e. when no additional heat is applied to the test sample other than that supplied by the "isothermal bath" of the enclosing room. This room temperature or "background temperature" may also be referred to as the reference temperature.

During a four-point probe resistance measurement, joule heating leads to an instantaneous temperature rise $\Delta T(r)$ within the probed material. According to Ohm's law, this effective temperature rise can be expressed as:

$\Delta T(r) = \beta(r)I^2.$ where I is the current, and $\beta(r)$ is a thermal scaling function, proportional to the electric resistance at a particular location r, and to thermal spreading resistance away from it. For a thin wire of length L and cross sectional area A, in thermal contact with an insulating substrate of thermal conductivity $\kappa$ occupying the halfspace below the wire, the thermal scaling function $\beta$ may be approximated as spatially invariant:

$$\beta = \frac{2\rho}{\pi\kappa A}\left\{\arcsin\frac{A}{Ld} + \frac{A}{Ld}\arcsin\frac{Ld}{A} + \frac{Ld}{3A}\left[1 + \frac{1}{(Ld/A)^3} - \left(1 + \frac{1}{(Ld/A)^2}\right)^{3/2}\right]\right\}.$$

For an infinite thin sheet of thickness d, with an insulating substrate of thermal conductivity $\kappa$ occupying the halfspace below the thin sheet, the thermal scaling function $\beta$ may be approximated as:

$$\beta(x', y') = \frac{\rho/d}{4\pi^3\kappa}\int_{-\operatorname{arcsinh}(a/r_0)}^{\operatorname{arcsinh}(a/r_0)}\int_0^{2\pi}\frac{d\sigma' d\tau'}{\left[x' - \frac{a\sinh\tau'}{\cosh\tau' - \cos\sigma'}\right]^2 + \left[y' - \frac{\sinh\tau'}{\cosh\tau' - \cos\sigma'}\right]^2}.$$

where $r_0$ is the electrical contact size of the current-conducting electrodes with the sample, and x' and y' are transformed coordinates according to:

$$\begin{bmatrix} x' \\ y' \\ 1 \end{bmatrix} = \begin{bmatrix} \cos\theta & \sin\theta & 0 \\ -\sin\theta & \cos\theta & 0 \\ 0 & 0 & 1 \end{bmatrix}\begin{bmatrix} 1 & 0 & -(x_i+x_j)/2 \\ 0 & 1 & -(y_i+y_j)/2 \\ 0 & 0 & 1 \end{bmatrix}\begin{bmatrix} x \\ y \\ 1 \end{bmatrix},$$

$\theta = \operatorname{atan2}(y_j - y_i, x_j - x_i).$

For an electrically conducting bulk halfspace with thermal conductivity $\kappa$, the thermal scaling function $\beta$ can be approximated as:

$$\beta(x, y, z) = \frac{1}{2\pi\kappa}\left(\frac{R_{C,i}}{\sqrt{(x-x_i)^2 + y^2 + z^2}} + \frac{R_{C,j}}{\sqrt{(x-x_j)^2 + y^2 + z^2}}\right).$$

where $R_{C,i}$ and $R_{C,j}$ refer to contact resistances at the proximity of the tips of the first and the second current conducting electrode.

Other expressions of $\beta$ can be derived for more specific combinations of domain and substrate geometry.

By combining the presented equations $$R = \frac{1}{g}\int_\Omega \rho(r)\hat{S}(r)dr,$$

$\rho = \rho_0(1+\alpha\Delta T)$, and $\Delta T(r) = \beta(r)I^2$, we obtain $$R = \frac{\rho_0}{g}\int_\Omega [1 + \alpha\beta(r)I^2]\hat{S}(r)d\Omega.$$

which can be further rearranged as:

$$\frac{R}{R_0} = 1 + \alpha M I^2, \quad M = \int_\Omega \hat{S}(r)\beta(r)d\Omega.$$

where $R_0$ is the zero-current transfer resistance at I→0, and M is a product of local sensitivity $\hat{S}(r)$ with the local thermal scaling function $\beta(r)$, integrated over the entire sampling domain. Given that M can be calculated based on realistic estimates of $\hat{S}(r)$ and $\beta(r)$, the magnitude of the electric current I be varied over a range of values, and the ratio $R/R_0$ be experimentally measured with high precision and accuracy, it is possible to solve the above equation for $\alpha$, that is the TCR of the probed material. The determination of $\alpha$ can occur via several experimental pathways as detailed below.

For an AC electrical current with an amplitude of $I_0$ and an angular frequency $\omega$, spreading through a material with a zero-current resistance $R_0$, the measured voltage may be modelled via the linearized resistance model as:

$$V = I_0 \sin(\omega t) \cdot R_0[1 + \alpha \Delta T].$$

which by substitution of $\Delta T = \beta [I_0 \sin(\omega t)]^2$, and use of trigonometric identities, can be expanded to:

$$V = R_0 \left\{ \left[ I_0 \sin(\omega t) + \frac{3}{4}\alpha \beta I_0^3(\omega t) \right] - \frac{1}{4}\alpha \beta I_0^3 \sin(3\omega t) \right\}.$$

The voltage amplitudes at the fundamental frequency and at the third harmonic frequency can be isolated mathematically by selecting the corresponding terms in the equation above, and experimentally by a lock-in amplifier, which returns a root-mean-square value $V_{rms}$ over an integer number of cycles at a frequency of choice. Isolating the $1\omega$ and $3\omega$ terms in the equation above, and subjecting the variables to the root-mean-square transformation over an integer number of cycles, we obtain:

$$V_{rms,1\omega} = R_0 \left[ I_{rms} + \frac{3}{2}\alpha \beta I_{rms}^3 \right].$$

$$V_{rms,3\omega} = -\frac{1}{2}\alpha \beta R_0 I_{rms}^3.$$

where the subscript rms denotes an root-mean-square transformed variable (e.g. $I_{rms} = I_0/\sqrt{2}$). Noticing the common term in $V_{1\omega,rms}$ and $V_{3\omega,rms}$, we finally obtain:

$$R_0 = \frac{V_{rms,1\omega} + 3V_{rms,3\omega}}{I_{rms}} = R_{rms,1\omega} + 3R_{rms,3\omega}.$$

Thus, the resistance at the reference temperature is a function of the injected current, the voltage at the fundamental frequency, and three times the voltage at the third harmonic frequency (all values in rms).

To determine the temperature coefficient of resistance, one may use the above relationships in a direct manner to write:

$$\frac{R}{R_0} = \frac{R_\omega}{R_\omega + 3R_{3\omega}} = 1 + \alpha M I^2.$$

Making the substitutions:

$$x = MI^2, \quad y = -\left(1 + \frac{R_\omega}{3R_{3\omega}}\right)^{-1}.$$

it is easy to see that the temperature coefficient of resistance $\alpha$ corresponds to the linear slope of y vs. x, which should further intersect the origin.

Alternatively, one may obtain $\alpha$ from a differential, that is to say dual set of measurements, subtracted from one another. For two symmetric pin configurations A and A', the first harmonic resistances at zero heating are equal:

$$R_{A,0} = R_{A',0}.$$

while the increase of resistance with current is different:

$$\frac{R_A}{R_{A,0}} = 1 + \alpha M_A I^2, \quad \frac{R_{A'}}{R_{A',0}} = 1 + \alpha M_{A'} I^2.$$

Subtracting the first harmonic resistances of these two configurations from one another yields:

$$\frac{R_A - R_{A'}}{R_{A,0}} = \alpha (M_A - M_{A'}) I^2.$$

Given that $(R_A - R_{A'}) \ll R_{A,0}$, the above may be approximated as $y = (R_A - R_{A'})/R_A$, and $x = (M_A - M_{A'})I^2$, whose linear slope corresponds to $\alpha$ as before, however only dependent on first harmonic resistances.

As exemplified above, the extraction of $\alpha$ is possible from various combinations of first and third harmonic resistance, in either single or multiple configuration settings, enabling to cross-validate the internal consistency of the data and remove potential systematic errors or second-order effects.

Figures 2A, 2C:
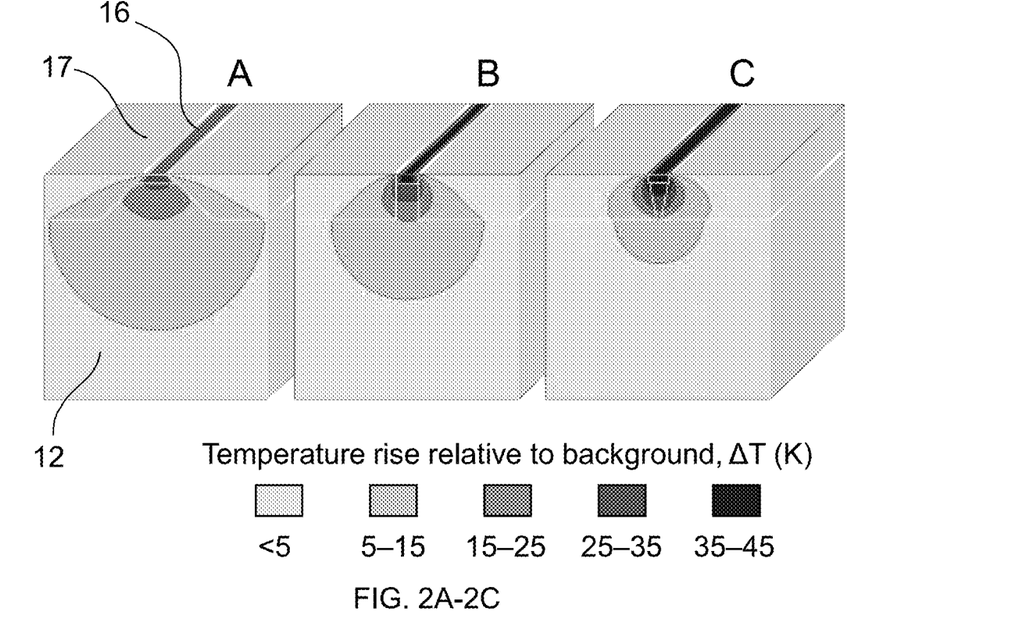

FIGS. 2A-C illustrates three different profiles of a fin 16 having three different fin aspects ratios. FIG. 2A illustrates a fin having a wider base than top, i.e. with a fin aspect ratio greater than one. FIG. 2B illustrates a fin having perfectly vertical sidewalls, i.e. same width at the top as at the base so that the fin aspect ratio is one. FIG. 2C illustrates a fin having a narrower base than top, i.e. with a fin aspect ratio smaller than one. In each of FIGS. 2A-C, it is illustrated that the fin is heated to a temperature higher than background temperature, for example by applying an electrical current traversing the fin.

Heat transfer in the test sample means that the heat in the fin will spatially distribute in the test sample. How the heat will be distributed and how the temperature gradient will evolve is illustrated by the different shades of grey separated by isotherm lines (darkest fill color illustrates the highest temperature at the fin where the current runs and lightest fill color illustrates the lowest temperature progressively away from the fin).

The heat flow both within the fin as well as away from the fin into the rest of the test sample depends among other things on the shape and geometry of the fin. In other words, the thermal resistance, or how temperature evolves inside and outside of the fin, strongly depends on the shape and geometry of the fin. It is seen that for the fin in FIG. 2A having a fin aspect ratio greater than one, heat is dissipated farther away from the fin than compared to the two other shapes of fins illustrated in FIGS. 2B and 2C respectively. High temperature is most localized in fins with high aspect ratios, e.g. the fin depicted in FIG. 2C, and is least localized in fins with low aspect ratios, e.g. the fin depicted in FIG. 1A.

Figure 2D:
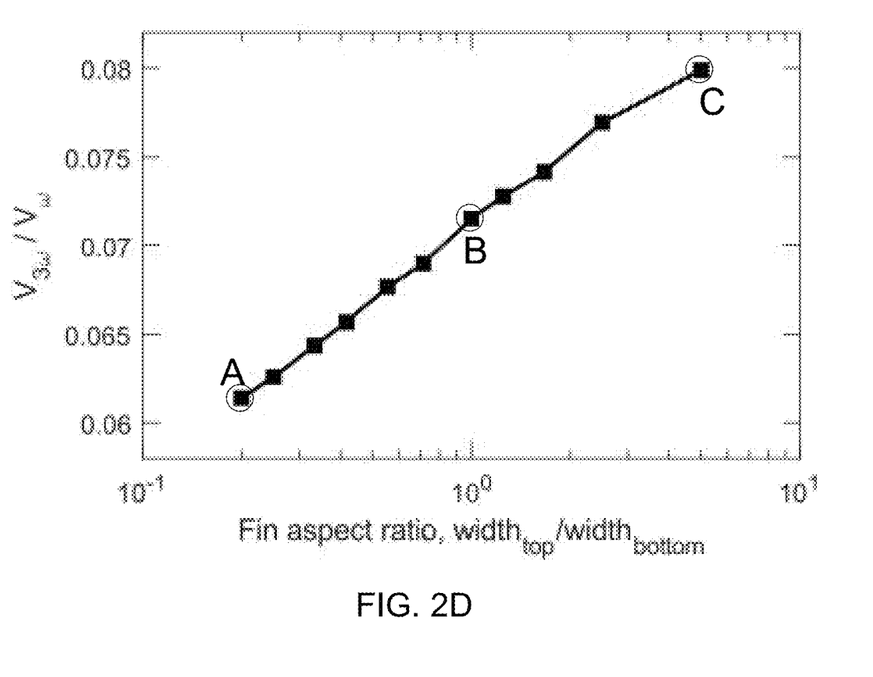
FIG. 2D shows a graph where the measured voltage is related to fin aspect ratio.

It is assumed that the substrate 12 is the same in all of FIGS. 2A-C, and that the top of the fin 16 and the electrically insulating oxide 17 are also the same for all points simulated in FIG. 2D, and in all of FIGS. 2A-C. The electrical currents are also identical across all the simulated fins. Only the aspect ratio of the fin is varied in FIG. 2, and the resulting harmonic components of the measured voltage are numerically simulated and extracted. Changing the substrate and/or oxide can affect the heat transfer. For example, a substrate with a higher thermal conductivity will conduct more heat away from the fin, if all other material properties and geometries remain unchanged.

The change of resistance with temperature may be used to characterize the fin. In other words, the variation of the fins' ability to conduct and redistribute heat (variation that arises from the fins' geometry and shape), may be used to directly quantify a certain geometrical property of the fin (e.g. its aspect ratio), or indirectly infer whether or not the fin meets a certain required specification (e.g. aspect ratio above or below a required threshold).

A target may be defined for the test sample (the respective property of the test sample), for example the fin aspect ratio as in FIG. 2. A threshold may be defined as a set of certain experimental values or their ratios (e.g. voltage amplitudes), or a percentage from a desired ratio, or a percentage of a desired geometric property, beyond which the test sample would be rejected. Otherwise, the sample would be accepted. For example, if a threshold is 20% and the target fin aspect ratio is 1, the test sample is accepted if the measured fin aspect ratio is between 0.8 and 1.2.

The threshold may depend on the property to be measured or the target, i.e. if the specification has a large manufacturing tolerance, the threshold may be high, and if the tolerance is low, the threshold may be low.

The threshold may also depend on the measurement uncertainty.

For example, if the target is a fin aspect ratio of 1, the threshold may be defined to be 20%, but if the target is a fin aspect ratio of 1.2, the threshold may be defined to be 30%.

It may also be so that if there are two properties close to each other, for example test samples with desired aspect ratios of 1, and test samples with desired aspect ratios of 1.1, the threshold is not to be bigger than the difference between the two targets, i.e. for example not more than a threshold of 10%.

The test sample may be heated by applying a current through an arbitrary pair of electrodes. The temperature increase may depend on either current amplitude, or frequency, or both. Typically, a current amplitude is chosen such that the increase in temperature would be measurable, i.e. the current should not be too small such as the electric noise in general would be greater than the voltage to be measured due to the temperature increase.

Naturally, the current should also not be too large to impose detrimental or irreversible effects upon the test sample.

The measurement of the voltage could then take place at a point in time after the current is applied, so that the test sample has had time to reach a thermal equilibrium, i.e. thermal steady state. The time delay between current switching and voltage measurement may depend on the current, the shape and dimension of the test material, and its physical properties, such as thermal conductivity and/or resistivity.

The measurement may take place by applying an alternating current $I_0 \sin(\omega t)$ across the first pair of electrodes having a smaller amplitude than the current used for heating, and measuring the voltage across the second electrode pair, while current is applied across the first electrode pair.

The temperature dependence of the resistivity will depend on the amplitude/value at the third harmonic frequency. Thus, for the third harmonic frequency, the measured voltage will have the proportionality relationship $V_{3\omega} \sim \sin(3\omega t)$.

The value at the third harmonic which is proportional to the amount of heating may be found by filtering the measured voltage or by studying the frequency domain, i.e. by decomposing the measured voltage into a continuum of underlying frequencies that sum up to the observed signal.

A set of reference values may be determined in order to correlate a measured voltage to a specific sample property, i.e. a reference set may be defined comprising a number of pairs of voltage V and property P, i.e. (V, P). Such a reference set may be calibrated on known materials to establish a functional relationship (either empirical or theoretical) between the observed voltage and the sample property of interest V=f (P), and then utilized in a reverse sense on unknown samples, to obtain sample properties from the observed voltage $P=f^{-1}(V)$. Note that since V can be recorded at multiple frequencies, composite reference sets, e.g. pairs of $(V_{3\omega}/V_{1\omega},P)$, or multivariate reference sets, e.g. triplets of $(V_{1\omega}, V_{3\omega},P)$, or the like, can likewise be constructed and used as interpolation (look-up) tables for specific sample properties of interest.

For example, assuming a set of test samples having fins with known fin aspect ratios, which have been determined e.g. optically by use of a microscope. A current (preferably of the same value in each measurement) is injected into each known fin, and the voltage may be measured such that for each specific fin aspect ratio, the associated voltage is known. This is how the numerically-simulated relationship in FIG. 2D could be determined experimentally.

For a test sample comprising of a fin with an unknown aspect ratio, its aspect ratio may be determined by comparing the measured voltage due to an applied current to a set of reference values, i.e. to determine whether the measured voltage is comparable to one of the voltages in the set of reference values (i.e. in particular, the amplitudes and phases of the first and third harmonic frequencies of the voltage). If it is, it may be inferred that the unknown fin has a fin aspect ratio comparable to that of the reference measurement.

FIG. 2D shows a graph where the measured voltage is related to fin aspect ratio.

The voltage metric is shown along the y-axis. Specifically, the graph shows the amplitude of the third harmonic frequency ($3\omega$), $V_{3\omega}$, normalized/scaled by the amplitude of the fundamental ($\omega$), $V_{1\omega}$, i.e. the ratio of the third over the first harmonic voltage $V_{3\omega}/V_{1\omega}$.

In the plot, the fin aspect ratio shown along the x-axis increases with voltage, going from a fin aspect ratio of 1/5 for the leftmost point on the curve to a value of 5 for the rightmost point on the curve.

The fin from FIG. 2A is illustrated as the filled square next to the "A". For this fin, a ratio of the third over the first harmonic voltage of 0.061 is measured.

The fins from FIGS. 2B and 2C are also illustrated, and for these fins, the measured ratios of third to first harmonic voltages are around 0.072 and 0.080 respectively.

FIG. 2D may constitute a set of reference values.

For example, a test sample having a fin with an unknown fin aspect ratio is measured having a third over first harmonic voltage ratio of 0.07. It may then be inferred that it is likely that the unknown fin has an aspect ratio of around one.

Alternatively, it may be desired that the test sample is to have a fin with a fin aspect ratio of one within a threshold/margin of 20%. A voltage of 0.075 is measured. However, this corresponds to a fin aspect ratio of 2, which is outside the set threshold/margin. The test sample does therefore not meet the desired specification.

Figure 3A:
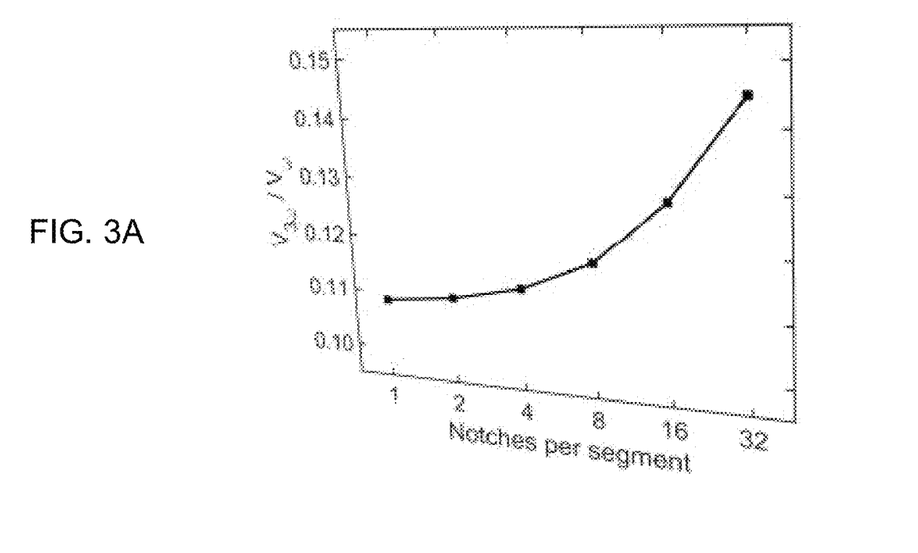
FIG. 3A shows the effect of the six different shapes/geometries on the measured voltage when an electric current is conducted along the line.
Figure 3B:
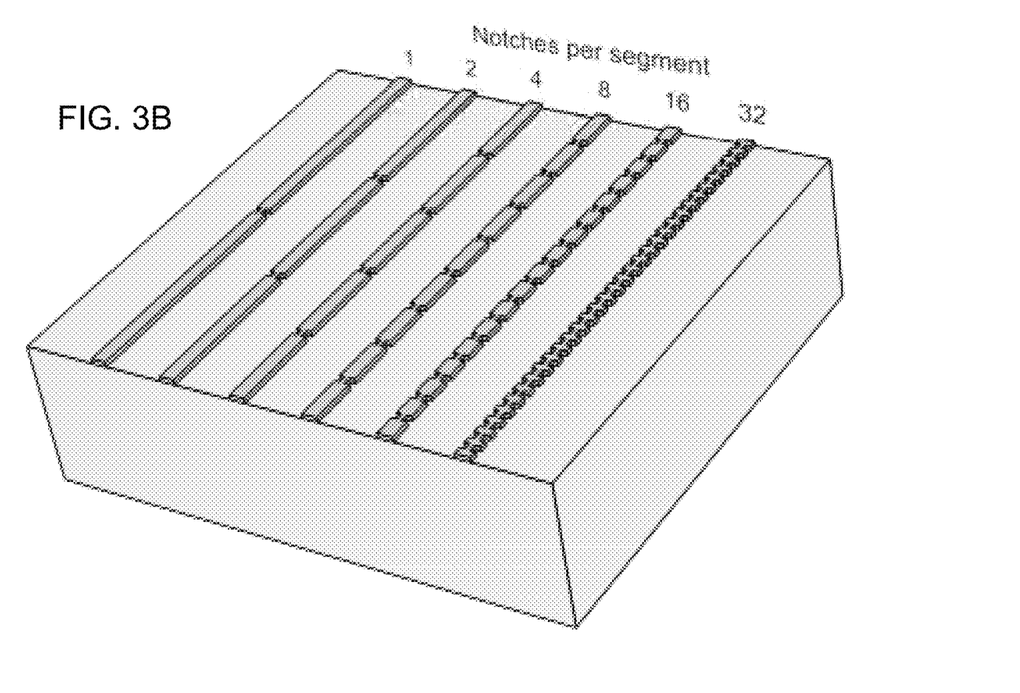
FIG. 3B shows six examples of different electric lines in a test sample.

FIGS. 3A-3B are an example of another property of a test sample that may be measured thermoelectrically.

FIG. 3B shows six examples of different electric lines in a test sample. The first line 30 has a single notch 32 (indentation) along its length, i.e. the line exhibits a narrow passage at its center. The line next to it has two notches. The third line has four notches. The fourth, fifth and sixth lines have 8, 16 and 32 notches, respectively. All notches are distributed equidistantly from one another, and exemplify otherwise similar lines with varying degrees of edge roughness.

FIG. 3A shows the effect of the six different shapes/geometries on the measured voltage when an electric current is conducted along the line. Specifically, it can be seen in FIG. 3A that the scaled third harmonic voltage increases in proportionality with the number of notches.

In a similar manner to how the measured voltage parameters were indicative of the fin aspect ratio (in cross section perpendicular to the current flow) in FIG. 2D, the measured voltage parameters in FIG. 3A show a set of reference values for the line shape (where the geometric property that can be monitored is along the current flow).

The set of reference values may be determined from measuring voltage on lines with known geometries, specifically by measuring the voltage between a pair of probe electrodes while applying a current along the line via another pair of probe electrodes, and defining pairs of voltage and notch numbers/densities ($V_{3\omega}/V_{1\omega}$,P).

The set of reference values comprising pairs of voltage harmonic ratios and notch density may be used to either determine whether a test sample consisting of a conducting line meets a certain specification, or to infer how many notches there likely are in a line.

For example, for an unknown test sample, a third to first harmonic voltage ratio of 0.11 is measured. Comparing to the set of reference values, it is seen that a third to first harmonic voltage ratio of 0.11 corresponds to a line having a single notch.

Similarly, it may be the manufacturing specification that a test sample should have a line with sixteen notches within a tolerance/threshold of for example 10%. If during measurement of a test sample, the observed voltage is 0.129 (which is within 10% of the reference with sixteen samples having a voltage of 0.13), it can be inferred that such a particular test sample is accepted, i.e. it is inferred that the measured line on the test sample is likely to have 16 notches.

In this way, a thermal electric property may be determined just by landing a four-point probe once on the sample and performing one test instead of having to land for example a multitude of times or performing a multitude of current injections before a new test sample can be tested. This reduces the influence of the measurement/test on the test sample, and is more efficient, enabling e.g. a large number of measurements to be made.

Figure 4A:
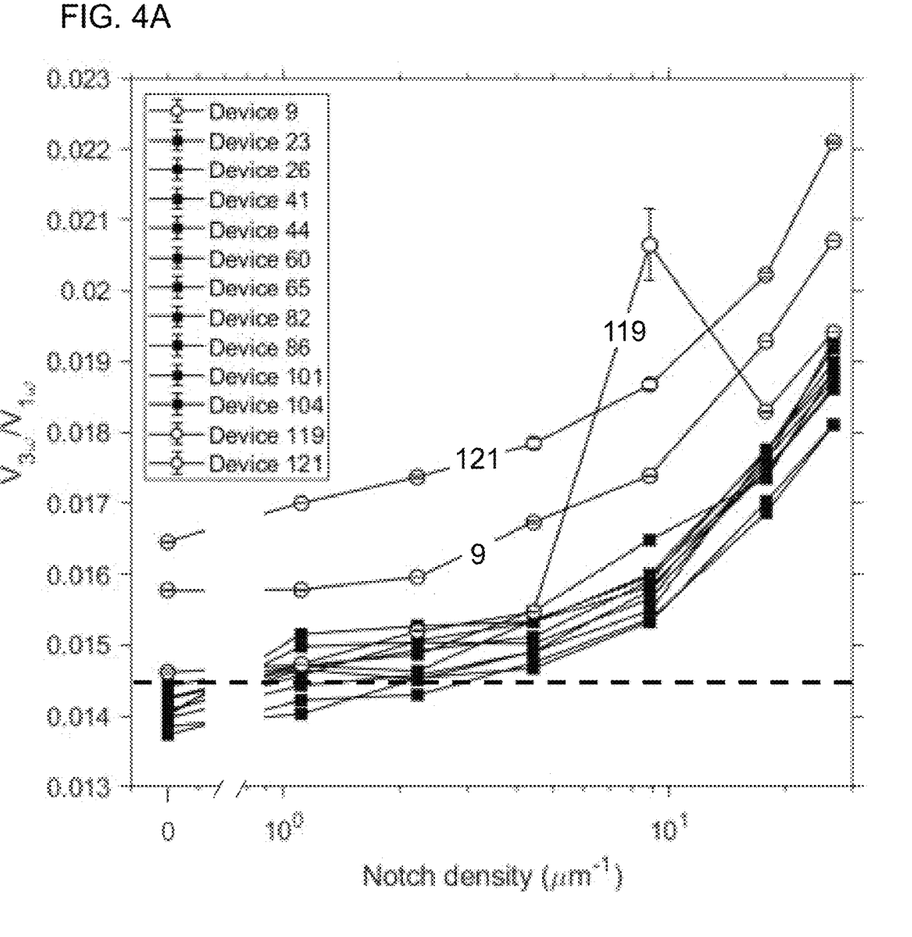
FIG. 4A shows experimental proof of the simulations in FIG. 3 on actual Cu nanowires.

FIG. 4A shows experimental proof of the simulations in FIGS. 3A-3B, on actual Cu nanowires, 9 μm in length, and ca. 4000 nm$^2$ in cross section, with a varying number of equally-spaced notches along the wire's length.

Each nanowire array contains seven individual nanowires, with notch density per unit length ranging from 0 to 26 μm$^{-1}$ in a geometric progression.

On FIG. 4A, data from 13 devices/test samples are shown and overlain on top of one another. The nanowire array in each device has been measured 9 times, and the measurement uncertainties are in the vast majority of measurements smaller than the symbol size in FIG. 4A.

Overall, the $V_{3\omega}/V_{1\omega}$ ratio increases smoothly and monotonically as a function of notch density, exactly as predicted by the simulations in FIGS. 3A-3B.

In ten out of the thirteen devices measured (devices 23, 26, 41, 44, 60, 65, 82, 86, 101, and 104), the measured $V_{3\omega}/V_{1\omega}$ ratios cluster tightly together (standard deviation of <2%), varying from ca. 0.0141±0.0002 for nanowires with no notches, to 0.0187±0.0004 for nanowires with the densest notching fabricated (26 μm$^{-1}$), which is in excess of 30% percent relative signal change.

Furthermore, the $V_{3\omega}/V_{1\omega}$ ratios of three devices (devices 9, 119, 121) markedly lie away from the data cluster, either having the same trend but a different intercept (devices 9, 121), or following the same trend as the majority of data but exhibiting one severe outlier (device 119).

Figure 4B:
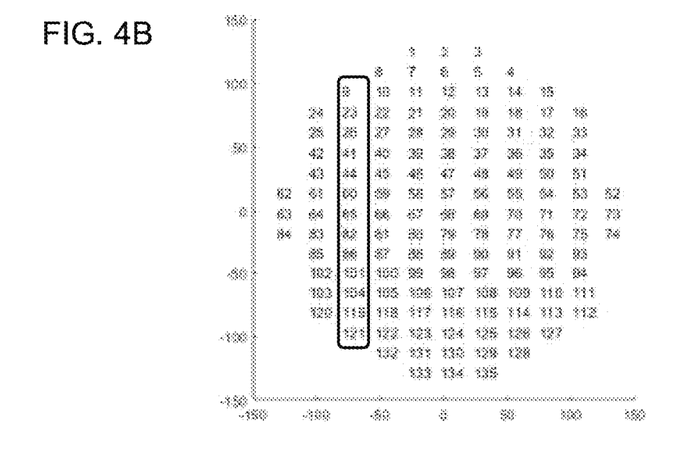
FIG. 4B indicates the location of the nanowire arrays (devices) on a 300 mm product wafer.

FIG. 4B indicates the location of the nanowire arrays (devices) on a 300 mm product wafer.

It is easy to see that the three outliers in FIG. 4A correspond to devices located at either the top (device 9) or the bottom (devices 119, 121) edges of the wafer.

Key fabrication parameters such as optical mask positioning and focus, chemical vapour flux rate, thermal activation by laser etc., may vary across the wafer, with the perimeter of the wafer as a particularly challenging area to keep the fabrication process the same as in the wafer's center.

Anomalously measured $V_{3\omega}/V_{1\omega}$ ratios in devices 9, 119, and 121 at the perimeter of the wafer may thus serve as an in-line metrology indication, that the material properties at the wafer's edges diverge beyond acceptable, and such devices are to be discarded from further production.

Alternatively, if acceptable, such devices with marginal properties (e.g. devices 9 and 121) or outliers (device 119) may call for additional attention and electrical testing, to make sure that their functionality is not compromised.

The data measured on the 13 test samples may be used as a data set for determining if a specific test sample of the 13 test samples should be accepted or rejected.

Thus, for a given notch density the data set will consist of 13 third harmonic voltages or 13 values derived therefrom. In general, the value of each third harmonic may be normalized with the value of the first harmonic or transformed/scale according to a function or value. For example, each data point in the data set may be the ratio as shown in FIG. 4A.

It can be seen in FIG. 4A that test samples 9, and 121 have third harmonic voltages that are above the rest of the test samples and the rest of the sample have the third harmonic values "cluster" together, i.e. not deviating from each other with more than 25%. The test sample 119 is excluded from the cluster, because it has an outlier/anomaly.

The test sample in the "cluster" having the highest third harmonic may be set as a threshold for accepting or rejecting a test sample, i.e. a test sample having a third harmonic above the threshold may be rejected, and accepted if it is below. The threshold is illustrated as the striped horizontal line between 0.014 and 0.015 in FIG. 4A.

Alternatively, the mean and standard deviation of the third harmonics of the "cluster" may be used in order to determine if a test sample is to be accepted or rejected, for example if the test sample has a third harmonic that is more than one standard deviation from the mean it is rejected, and otherwise accepted.

The heat dissipated in the fin and/or other part(s) of the test sample being measured causes an increase in resistance.

Measuring the resistance at room temperature may therefore lead to a larger resistance value than what the resistance at room temperature is, due to the injected current.

Thus, the experimental resistance R=V/I, obtained from dividing the measured voltage V by the applied current I may contain a significant offset from the ideal resistance $R_0$ at room temperature.

The magnitude of this offset, arising from localized heating of the material by the applied electric current, depends on the current amplitude, frequency and shape of the material under test.

The said offset may be reduced for example by adding the amplitude of the third harmonic to the measured first harmonic voltage, i.e. $R_0=(V_{1\omega}+3V_{3\omega})/I$ or potentially some other scaling of the amplitude of the third harmonic.

Figure 5:
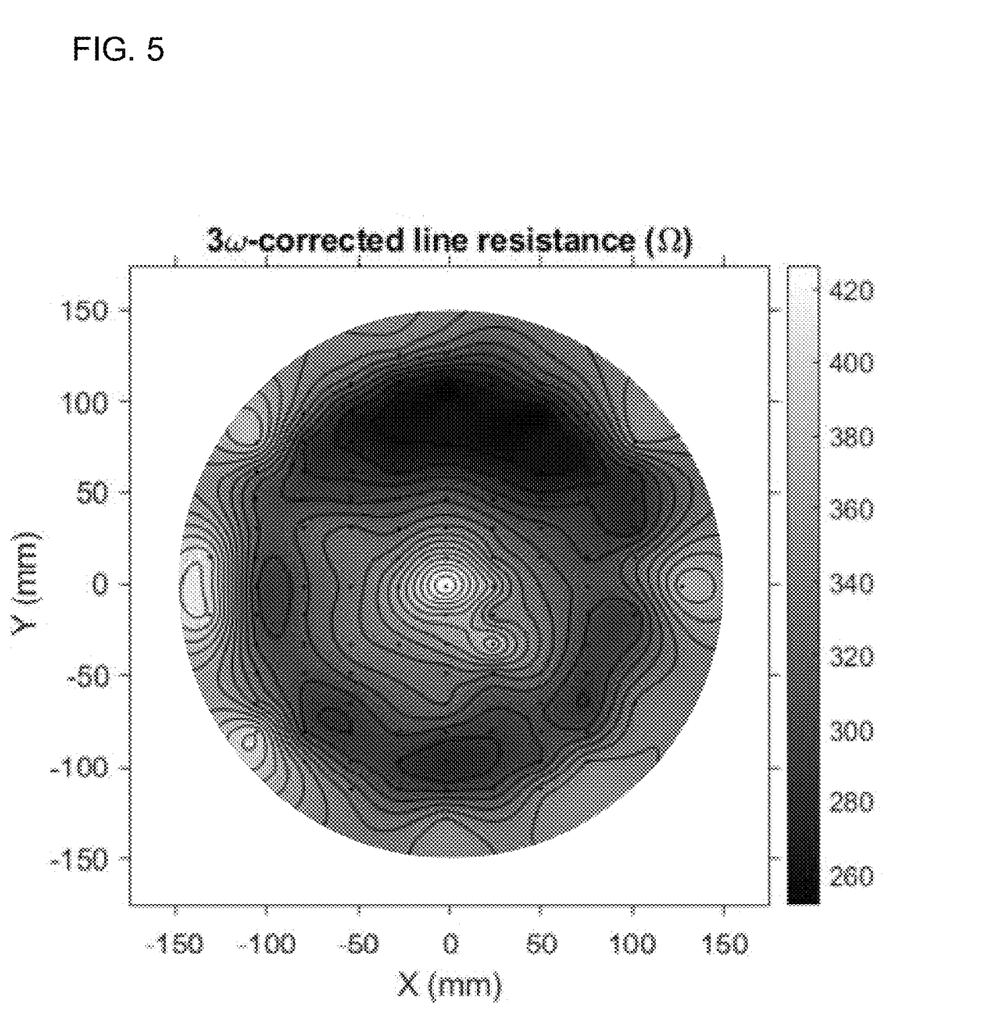
FIG. 5 shows an exemplary wafer map of the extrapolated zero-current nanowire line resistances.

FIG. 5 shows a 300 mm wafer map of the extrapolated zero-current nanowire line resistances, as obtained using the $R_0=(V_{1\omega}+3V_{3\omega})/I=R_{1\omega}+3R_{3\omega}$ formula, for a subset of the notchless Cu nanowires (9 μm in length, and ca. 4000 nm² in cross section, as presented earlier).

The measurements are done at a r.m.s. AC current of 1 mA (13 Hz).

The average line resistance is 307±34Ω (N=110 devices).

The line resistance smoothly varies across the wafer between 260 and 420Ω, with anomalously high resistance only at the wafer's center and perimeter.

Figure 6:
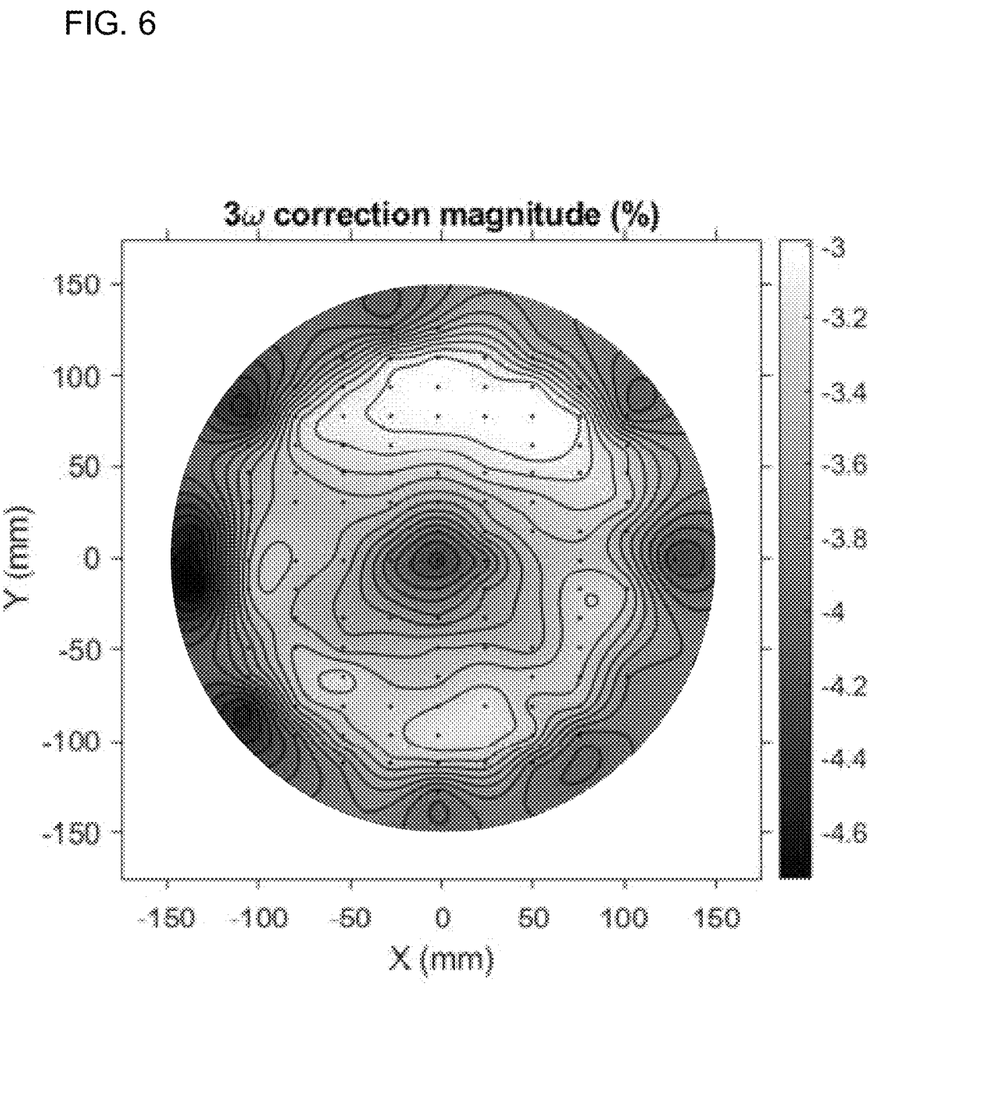
FIG. 6 shows an exemplary wafer map.

FIG. 6 shows a wafer map of $R_0/R-1$, i.e. the relative magnitude of the correction as introduced by the formula $R_0=R_{1\omega}+3R_{3\omega}$ over the standard first-harmonic resistance readings $R=V_{1\omega}/I$.

The sign of all corrections is negative, their magnitudes varying between −4.68% and −3%. Given that the bulk TCR of Cu is positive, the negative signs of all corrections are perfectly in line with the expectation, that Joule heating increases the temperature of the nanowires as they are being measured, thus offsetting all line resistances to higher values.

These data demonstrate that resistance measurements done without the third harmonic correction may be significantly biased, by up to several percent, which may be detrimental for evaluating these devices' fabrication quality or proper functioning.

Figure 7:
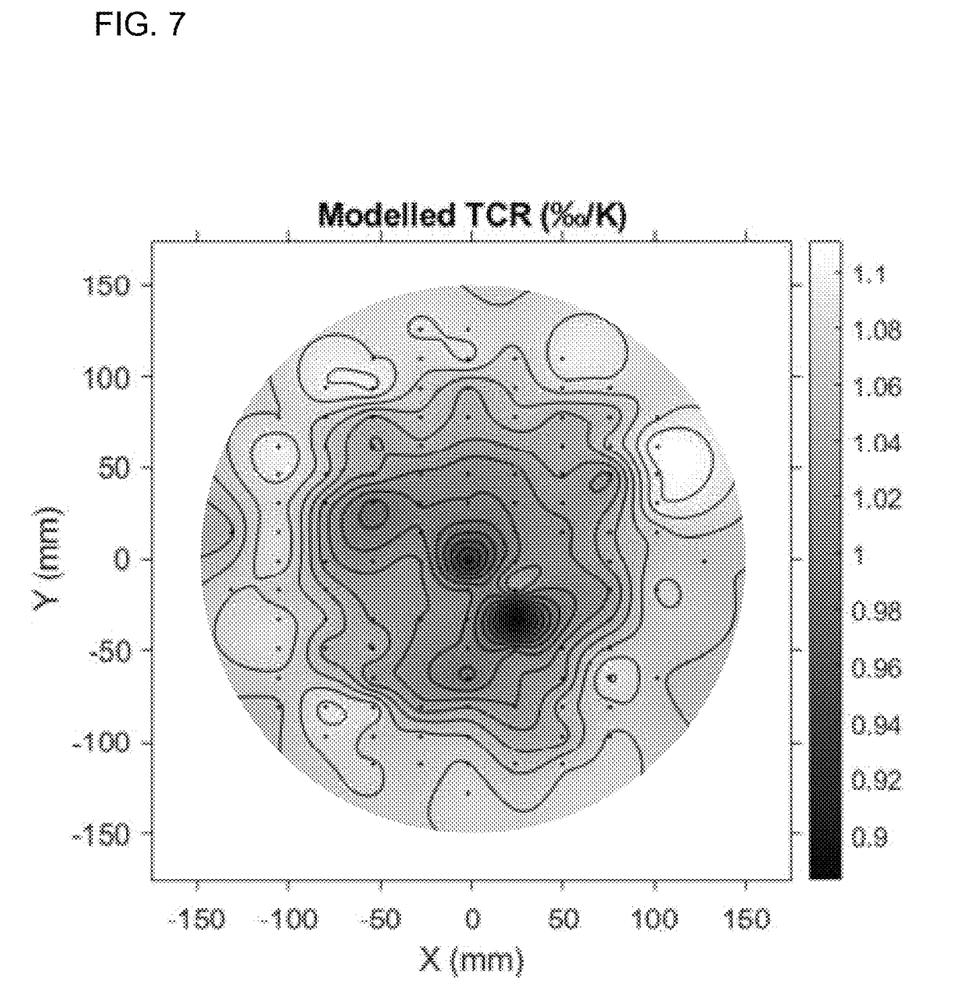
FIG. 7 shows a wafer map of the temperature coefficient of resistance (TCR) of the notchless nanowires presented in FIGS. 5-6.

FIG. 7 shows a wafer map of the temperature coefficient of resistance (TCR) of the aforesaid notchless nanowires presented in FIGS. 5-6.

It is based on the same measurements of $R_{1\omega}$ and $R_{3\omega}$ yet instead of linearly combining them into $R_0$, a thermal conductivity and resistance for the substrate is assumed (as detailed on p. 10 l. 24), and the ratio $R_{3\omega}/R_{1\omega}$ is converted into α through calculation of the corresponding $M=\int_\omega \hat{S}(r)\beta(r)d\Omega$. Such calculated TCR values range from 0.88 to 1.11% ‰/K, with 1.04±0.04‰/K on average.

These values are noticeably lower than TCR values of bulk Cu, which is perfectly in-line with the nanoscale dimensions of the nanowires which suppress carrier diffusion as predicted by the Mayades-Shatzkes theory.

The TCR wafer map is spatially smooth and somewhat reminiscent of the line resistance wafer map (FIG. 5), but performing a pairwise correlation of $R_0$ and α for N=110 values reveals that their pairwise correlation coefficient is rather low −0.37, strongly suggesting that these estimates are independent of each other.

Some or all of the steps disclosed herein can be performed by a controller. The controller can receive measurements, such as from the micro multi-terminal probe. The controller typically comprises a programmable processor, which is programmed in software and/or firmware to carry out the functions that are described herein, along with suitable digital and/or analog interfaces for connection to the other elements of system. Alternatively or additionally, the controller comprises hard-wired and/or programmable hardware logic circuits, which carry out at least some of the functions of the controller. In practice, the controller may comprise multiple, interconnected control units, with suitable interfaces for receiving and outputting the signals that are illustrated in the figures and are described in the text. Program code or instructions for the controller to implement various methods and functions disclosed herein may be stored in readable storage media, such as a memory in the controller or other memory.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method for measuring a property in response to a temperature modulation of a test sample, said method comprising:
    providing said test sample, said test sample being made of an electrically conducting or semiconducting material;
    providing at least two terminals and at least two or four electrically conducting interconnections between said terminals and said electrically conducting or semiconducting material, said two or four electrically conducting interconnections contacting two or four positions at said electrically conducting or semiconducting material;
    providing a power source and an electric circuit for generating a current and injecting said current into said electrically conducting or semiconducting material using said terminals;
    measuring a voltage across a part of said electrically conducting or semiconducting material using said terminals;
    determining said property as a function of a value of the third harmonic frequency component of said measured voltage; and
    defining a threshold for accepting or rejecting said test sample.

2. The method according to claim 1, further comprising determining said property as a function of said measured voltage.

3. The method according to claim 1, wherein said property is a temperature coefficient of resistance, thermal conductance, thermal conductivity, charge carrier concentration, electrical and thermal geometry, line edge roughness, side wall angle, resistance at room/reference temperature, Peltier coefficient, Seebeck coefficient, or electrical cross section of a conductor.

4. A method for screening a test sample, said method comprising:
- providing said test sample, said test sample being made of an electrically conducting or semiconducting material;
- providing at least two terminals, and at least two or four electrically conducting interconnections between said terminals and said electrically conducting or semiconducting material;
- said two or four electrically conducting interconnections contacting two or four positions at said electrically conducting or semiconducting material;
- providing a power source and an electric circuit for generating a current and injecting said current into said electrically conducting or semiconducting material using said terminals;
- measuring a voltage across a part of said electrically conducting or semiconducting material using said terminals;
- determining a third harmonic frequency component of said measured voltage;
- determining a threshold value for accepting or rejecting said test sample as a function of said third harmonic frequency component;
- accepting said test sample when a magnitude of said third harmonic frequency component is lower than said threshold; and
- rejecting said test sample when said magnitude of said third harmonic frequency component is higher than said threshold.

5. The method according to claim 4, further comprising providing a set of third harmonic frequency components of voltages measured on a set of samples.

6. The method according to claim 5, wherein said threshold is a function of said set of third harmonic frequency components.

7. The method according to claim 5, wherein said threshold is not more than 10% different than said third harmonic frequency component of said set of third harmonic frequency components having a greatest magnitude.

8. The method according to claim 4, further comprising determining an electric resistance of said electrically conducting or semiconducting material at reference temperature as a function of said current, said measured voltage, and a value of said third harmonic frequency component of said measured voltage.

9. The method according to claim 4, wherein said current has an amplitude for heating a domain or said test sample to a temperature above a background temperature.

10. The method according to claim 4, further comprising comparing said measured voltage to a set of reference values for screening a shape or determining a shape of an electrical component or interconnection.

11. The method according to claim 10, wherein said set of reference values comprises coordinates or pairs relating shapes of an electrically conducting layer or electrically conducting line is a function of voltage resulting from heating.

12. The method according to claim 10, wherein said set of reference values comprises coordinates or pairs relating shapes of an electrically conducting layer or electrically conducting line is a function of voltage at the third harmonic frequency resulting from heating.

13. The method according to claim 10, further comprising defining a target reference value in said set of reference values for accepting or rejecting said test sample.

14. The method according to claim 13, further comprising rejecting said test sample when a difference between said voltage and said target is greater than said threshold.

15. The method according to claim 13, further comprising accepting said test sample when a difference between said voltage and said target is smaller than said threshold.

16. The method according to claim 10, further comprising comparing said measured voltage to said set of reference values.

17. A method for determining the temperature coefficient of resistance, said method comprising:
- providing said test sample, said test sample being made of an electrically conducting or semiconducting material;
- providing a set of terminals including at least four terminals and at least four electrically conducting interconnections between said terminals and said electrically conducting or semiconducting material, said four electrically conducting interconnections contacting four positions at said electrically conducting or semiconducting material;
- providing a power source and an electric circuit for generating a current;
- injecting a first current into said test sample using a first combination of two terminals from said set of terminals;
- measuring a first voltage using a second combination of two terminals from said set of terminals;
- injecting a second current into said test sample using a third combination of two terminals from said set of terminals;
- measuring a second voltage using a fourth combination of two terminals from said set of terminals; and
- determining the temperature coefficient of resistance or a value proportional to the temperature coefficient of resistance as a function of said first current, said second current, said first voltage, and said second voltage.

18. The method according to claim 17, wherein said third combination is equal to said second combination and wherein said fourth combination is equal to said first combination.

19. The method according to claim 17, wherein said first combination is different than said third combination.

20. The method according to claim 17, wherein said second combination is different than said fourth combination.

* * * * *